(12) United States Patent
Kim

(10) Patent No.: US 11,777,042 B2
(45) Date of Patent: Oct. 3, 2023

(54) PLASMONIC FIELD-ENHANCED PHOTODETECTOR AND IMAGE SENSOR

(71) Applicant: Hoon Kim, La Habra, CA (US)

(72) Inventor: Hoon Kim, La Habra, CA (US)

(*) Notice: Subject to any disclaimer, the term of this patent is extended or adjusted under 35 U.S.C. 154(b) by 0 days.

(21) Appl. No.: 17/574,714

(22) Filed: Jan. 13, 2022

(65) Prior Publication Data

US 2022/0140164 A1    May 5, 2022

Related U.S. Application Data

(63) Continuation of application No. 16/919,831, filed on Jul. 2, 2020, now Pat. No. 11,245,044.

(60) Provisional application No. 62/961,029, filed on Jan. 14, 2020.

(51) Int. Cl.
*H01L 31/0352* (2006.01)
*H01L 27/146* (2006.01)
*H01L 31/103* (2006.01)

(52) U.S. Cl.
CPC ........... *H01L 31/035209* (2013.01); *H01L 27/14623* (2013.01); *H01L 27/14665* (2013.01); *H01L 31/103* (2013.01)

(58) Field of Classification Search
CPC ......... H01L 27/14623; H01L 27/14665; H01L 27/14669; H01L 27/14667; H01L 27/14676; H01L 27/14667; H01L 27/1462; H01L 27/14601; H01L 27/146; H01L 31/035209; H01L 31/0352; H01L 31/103; H01L 31/102; H01L 31/101
See application file for complete search history.

(56) References Cited

U.S. PATENT DOCUMENTS

| | | | | |
|---|---|---|---|---|
| 5,625,729 A | * | 4/1997 | Brown | .................. G02F 1/025 385/12 |
| 5,683,934 A | * | 11/1997 | Candelaria | ........ H01L 29/66068 257/E21.409 |
| 6,052,238 A | * | 4/2000 | Ebbesen | ................ B82Y 20/00 385/5 |

(Continued)

FOREIGN PATENT DOCUMENTS

| | | |
|---|---|---|
| KR | 10-2014-0092123 A | 7/2014 |
| KR | 10-2014-0124316 A | 10/2014 |
| WO | 2015/126373 A1 | 8/2015 |

OTHER PUBLICATIONS

Extraordinary Optical transmission: Fundamentals and Application, Sergio G. Rodrigo et al., Proceedins of the IEEEI Vo. 104, No. 12, Dec. 2016 pp. 2288-2306 (19 pages).

(Continued)

*Primary Examiner* — John R Lee
(74) *Attorney, Agent, or Firm* — BRYAN CAVE LEIGHTON PAISNER LLP

(57) ABSTRACT

A photodetector includes a metal layer that shields incident light and generates surface plasmon polaritons (SPPs), a light absorbing layer that absorbs the generated SPPs and allows charges excited by the absorbed SPPs and a localized electric field effect to tunnel, a dielectric formed at nanoholes in which at least a part of the metal layer is opened, and a semiconductor layer that induces the photocurrent based on an electric field effect of tunneled electrons. The SPPs form localized surface plasmons (LSPs) at an interface where the metal layer meets the dielectric.

16 Claims, 6 Drawing Sheets

(56) References Cited

U.S. PATENT DOCUMENTS

| | | | |
|---|---|---|---|
| 6,285,020 B1* | 9/2001 | Kim | G02B 5/1866 250/201.3 |
| 6,408,123 B1* | 6/2002 | Kuroda | B82Y 20/00 359/368 |
| 7,773,228 B1* | 8/2010 | Hollingsworth | G01N 21/553 359/585 |
| 8,149,411 B2* | 4/2012 | Johansen | G01N 21/553 356/244 |
| 8,653,618 B2* | 2/2014 | Kim | H01L 27/14645 257/E33.076 |
| 9,036,960 B2* | 5/2015 | Augusto | H01L 27/14621 385/14 |
| 9,397,241 B2* | 7/2016 | Berini | H01L 31/02327 |
| 9,537,027 B2* | 1/2017 | Lu | H01L 31/02327 |
| 9,780,240 B2* | 10/2017 | Lu | H01L 31/035218 |
| 10,312,389 B2* | 6/2019 | Chanda | H01L 31/02327 |
| 10,784,387 B2* | 9/2020 | Chanda | G01N 21/553 |
| 11,245,044 B2* | 2/2022 | Kim | H01L 27/14623 |
| 11,302,836 B2* | 4/2022 | Kim | H01L 27/1461 |
| 2004/0227169 A1 | 11/2004 | Kubo et al. | |
| 2005/0167709 A1 | 8/2005 | Augusto | |
| 2010/0295143 A1 | 11/2010 | Yokogawa | |
| 2011/0175183 A1* | 7/2011 | Nabet | H01L 31/02327 257/E31.066 |
| 2012/0280345 A1 | 11/2012 | Zhu et al. | |
| 2013/0056806 A1* | 3/2013 | Kim | H01L 27/14645 257/E31.085 |
| 2014/0346357 A1 | 11/2014 | Jarrahi et al. | |
| 2015/0109606 A1 | 4/2015 | Peale et al. | |
| 2015/0162462 A1* | 6/2015 | Berini | H01L 31/0236 438/69 |
| 2016/0365463 A1 | 12/2016 | Lee et al. | |
| 2017/0084764 A1* | 3/2017 | Lu | H01L 27/1446 |
| 2017/0127024 A1 | 5/2017 | Yokogawa | |
| 2018/0013022 A1 | 1/2018 | Lu et al. | |
| 2019/0148452 A1* | 5/2019 | Xin | H04N 5/33 257/432 |
| 2019/0178709 A1* | 6/2019 | Lee | G01J 1/0407 |
| 2019/0229223 A1* | 7/2019 | Chanda | H01L 31/09 |
| 2019/0237611 A1 | 8/2019 | Kim | |
| 2019/0259890 A1* | 8/2019 | Lu | H01L 31/09 |
| 2019/0331598 A1* | 10/2019 | Dutta | G01N 21/01 |
| 2019/0378716 A1* | 12/2019 | Min | H01L 21/0262 |
| 2021/0033462 A1* | 2/2021 | Zhang | H01L 27/14625 |
| 2021/0066373 A1* | 3/2021 | Toda | G02B 1/11 |
| 2022/0140164 A1* | 5/2022 | Kim | H01L 31/103 250/208.1 |
| 2022/0209034 A1* | 6/2022 | Kim | H01L 27/14665 |

OTHER PUBLICATIONS

S. Yasunaga, T. Kan, H. Takahata and I. Shimoyama, "Infrared Photodetector with Copper Resonator in Silicon Nanohole Array," 2019 20th International Conference on Solid-State Sensors, Actuators and Microsystems & Eurosensors XXXIII (Transducers and Eurosensors XXXIII), Berlin, Germany (2019).

Lin, et al. "Plasmonics-Based Multifunctional Electrodes for Low-Power-Consumption Compact Color-Image Sensors," Applied Materials & Interfaces, vol. 8, No. 10, pp. 6718-6726, Mar. 2016.

Alavirad, et al. "High-Responsivity Sub-Bandgap Hot-Hole Plasmonic Schottky Detectors," Optics Express, vol. 24, No. 20, pp. 22544-22554, Sep. 20, 2016.

Nickels, et al. "Metal Hole Arrays as Resonant Photo-Coupler for Charge Sensitive Infrared Phototransistors," IEEE Journal of Quantum Electronics, vol. 46, No. 3, pp. 384-390, Mar. 2010.

* cited by examiner

PLASMONIC FIELD-ENHANCED PHOTODETECTOR AND IMAGE SENSOR

CROSS-REFERENCE TO RELATED APPLICATIONS

This application is a Continuation of application Ser. No. 16/919,831 filed on Jul. 2, 2020, which claims priority from Provisional Application No. 62/961,029 filed on Jan. 14, 2020. The aforementioned applications are incorporated herein by reference in their entireties.

TECHNICAL FIELD

The disclosure relates to a plasmonic field-enhanced photodetector, and more particularly, to a technique utilizing the phenomenon that collective oscillations of free electrons, known as surface plasmons (SPs) are created by coupling between light and free electrons on a metal surface and combined with light waves into surface plasmon polaritons (SPPs), and the SPPs create a strongly enhanced electric field at a metal-dielectric interface.

RELATED ART

Similarly to a general metal-oxide-semiconductor field-effect transistor (MOSFET) structure, a photodetector is fabricated in a standard complementary metal oxide silicon (CMOS) process, so that current flows between a source and a drain.

However, concentration of incident light on a gate leads to active light excitation in polysilicon and doped ions inside the gate in which a light absorbing layer is located, the interface between an oxide film and a silicon substrate, and the silicon substrate. Further, charges which have absorbed energy tunnel into the gate from a channel region formed between the oxide film and the silicon substrate or a drain electrode to which a driving voltage is applied, through the oxide film. This tunneling forms a charge depletion layer between the gate and the oxide film, causing a change in the total charge amount of the gate.

The change in the charge amount and a gate electric field, caused by the tunneling, directly leads to a decrease of the threshold voltage of a channel. After the tunneling, light incident on the gate eventually induces photocurrent in the channel of the transistor. In addition, the gate that receives light is coupled to an external electrode to control output signal characteristics such as the intensities of the photocurrent and dark current of the channel, sensitivity, and a dynamic range, caused by the light, and to reset pixels.

The photodetector is typically formed to bring about photoelectric conversion by absorbing light into the gate.

The conventional photodetector has limitations in its effectiveness in reducing the size of the detector and the pixel size of an image sensor adopting the photodetector structure because incident light is directly absorbed into a gate of a smaller size than the wavelength band of the incident light and thus light excitation does not occur.

Moreover, there is a need for further increasing the internal quantum efficiency of incurring photoelectric conversion from charges directly excited by incident light.

SUMMARY

An aspect of the disclosure is to perform photoelectric conversion so that surface plasmon polaritons (SPPs) directly contribute to photocurrent, through surface plasmons (SPs) and SPPs created at interfaces with different dielectric constants by interaction between incident light and a metal layer.

Another aspect of the disclosure is to maximize a light sensing capability by tunneling charges, which are excited by SPPs generated through interaction between incident light and a metal layer and a localized electric field effect, into a separate space through an insulation film, thereby causing a change in the charge amount of the space and the size of a depletion layer and then affecting the threshold voltage of an adjacent current channel.

Additional aspects will be set forth in part in the description which follows and, in part, will be apparent from the description, or may be learned by practice of the presented embodiments of the disclosure.

According to an embodiment, a photodetector may generate photocurrent by absorbing surface plasmon polaritons (SPPs), the SPPs being generated by combining surface plasmons (SPs) with photons of a light wave.

According to an embodiment, the photodetector may generate the photocurrent by inducing the photocurrent through tunneling caused by the absorbed SPPs.

According to an embodiment, the photodetector may include a metal layer shielding incident light and generating the SPPs by interaction between photons of the shielded incident light and the SPs generated at an interface with a dielectric, a light absorbing layer absorbing the generated SPPs and allowing charges excited by the absorbed SPPs and a localized electric field effect to tunnel through an insulation film, and a semiconductor layer inducing the photocurrent based on an electric field effect of tunneled electrons.

According to an embodiment, at least a part of the metal layer may include an opened nanohole, and the generated SPPs may be absorbed into the light absorbing layer through the nanohole.

According to an embodiment, the nanohole may be formed of a material having a greater dielectric constant than air.

According to an embodiment, the nanohole may be formed of a material containing $Si_3N_4$.

According to an embodiment, the metal layer may contain at least one of aluminum (Al), gold (Au), or silver (Ag).

According to an embodiment, the metal layer may be extended from a surface to the light absorbing layer and guide the generated SPPs to the light absorbing layer.

According to an embodiment, an image sensor may include a metal surface, a metal nanohole array formed on the metal surface, and a detector array formed at a position corresponding to the metal nanohole array. The detector array may generate photocurrent by absorbing SPPs, the SPPs being generated by combining SPs formed on the metal surface with photons of a light wave.

According to an embodiment, the detector array may generate the photocurrent by inducing the photocurrent through tunneling caused by the absorbed SPPs.

According to an embodiment, the metal surface may shield incident light and generate the SPPs by interaction between photons of the shielded incident light and the SPs generated at an interface with a dielectric. The detector array may include a light absorbing layer absorbing the generated SPPs and allowing charges excited by the absorbed SPPs and a localized electric field effect to tunnel through an insulation film, and a semiconductor layer inducing the photocurrent based on an electric field effect of tunneled electrons.

According to an embodiment, the metal surface may be extended from a surface to the light absorbing layer and guide the generated SPPs to the light absorbing layer.

According to an embodiment, a method of operating a photodetector may include absorbing SPPs, the SPPs being generated by combining SPs with photons of a light wave, and generating photocurrent by using the absorbed SPPs.

According to an embodiment, the generation of photocurrent may include generating the photocurrent by inducing the photocurrent through tunneling caused by the absorbed SPPs.

According to an embodiment, a method of operating an image sensor may include generating photocurrent by using a metal nanohole array formed on a metal surface and a detector array formed at a position corresponding to the metal nanohole array. The generation of photocurrent may include absorbing SPPs, the SPPs being generated by combining SPs formed on the metal surface with photons of a light wave, by the detector array, and generating the photocurrent by using the absorbed SPPs by the detector array.

According to an embodiment, the generation of the photocurrent may include generating the photocurrent by inducing the photocurrent through tunneling caused by the absorbed SPPs.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
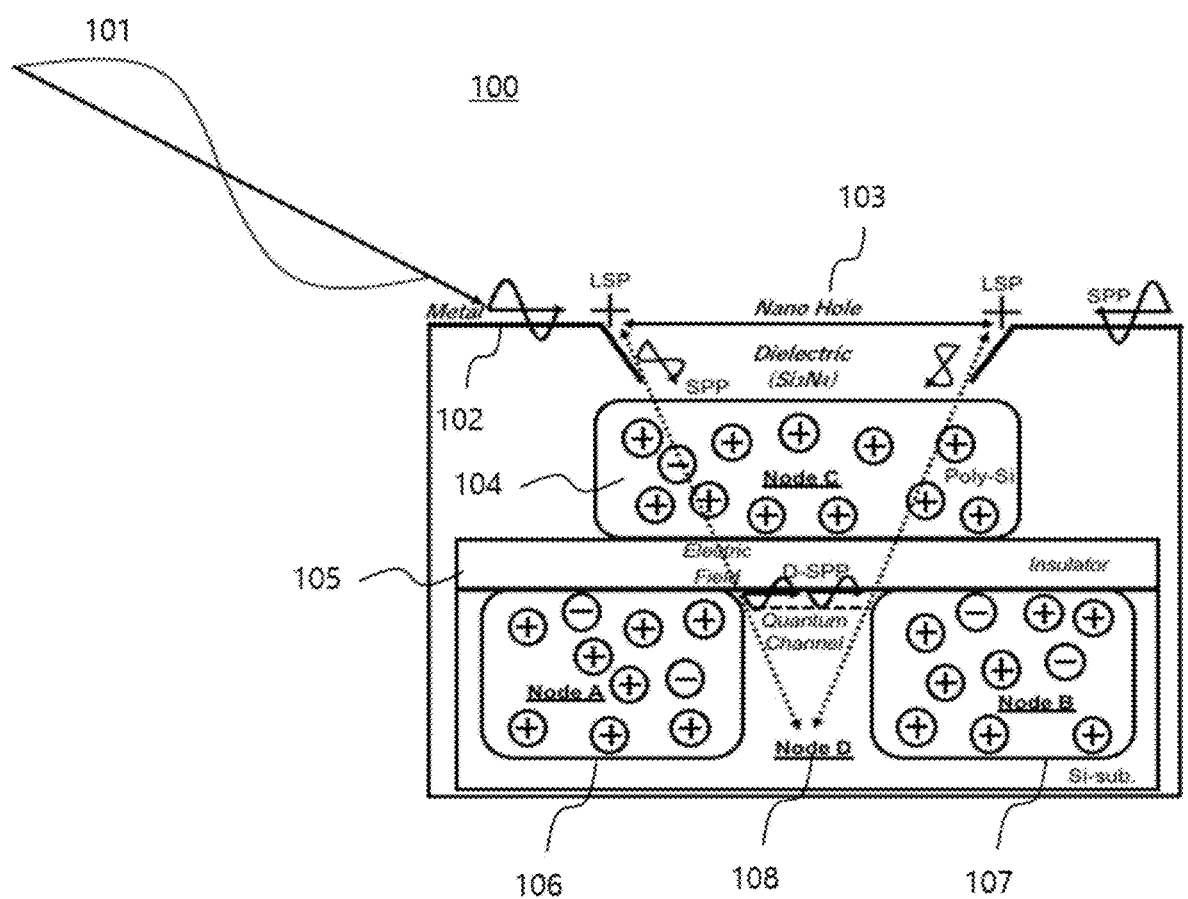
FIG. 1 is a diagram illustrating the structure of a photodetector according to an embodiment of the disclosure.

Specific structural or functional descriptions of embodiments according to the concept of the disclosure are mere examples presented only for the purpose of illustrating the embodiments according to the concept of the disclosure. The embodiments according to the concept of the disclosure can be implemented in various forms, not limited to the embodiments described herein.

It should be appreciated that various embodiments of the present disclosure and the terms used therein are not intended to limit the technological features set forth herein to particular embodiments and include various changes, equivalents, or replacements for a corresponding embodiment.

The term as used in the disclosure, "$1^{st}$", "$2^{nd}$", "first" or "second' may be used to describe various components, not limiting the components. These expressions are used to distinguish one component from another component. For example, a first component may be referred to as a second component and vice versa without departing the scope of the disclosure.

When it is said that a component is "coupled with/to" or "connected to" another component, it should be understood that the one component is connected to the other component directly or through any other component. On the other hand, when it is said that a component is "directly connected to" or "directly coupled to" another component, it may be understood that there is no other component between the components. Expressions describing the relationship between components, for example, "between" and "immediately between" or "directly neighboring to" should be interpreted similarly.

The terms as used herein are intended only to describe specific embodiments, not to limit the disclosure. It is to be understood that a singular form of a noun corresponding to an item may include one or more of the things, unless the relevant context clearly indicates otherwise. In the disclosure, the term "have", "may have", "include", or "may include" signifies the presence of a corresponding feature, number, function, operation, component, or part, or a combination of thereof, not excluding the presence of one or more other features, numbers, functions, operations, components, or parts, or combinations of thereof.

Unless otherwise defined, the terms including technical or scientific terms used in the disclosure may have the same meanings as generally understood by those skilled in the art. The terms as generally defined in dictionaries may be interpreted as having the same or similar meanings as or to contextual meanings of related technology. Unless otherwise defined, the terms should not be interpreted as ideally or excessively formal meanings.

Embodiments will be described below in detail with reference to the attached drawings. However, the scope of the disclosure is not limited to these embodiments. Through the drawings, like reference numerals denote the same components.

FIG. 1 is a diagram illustrating the structure of a photodetector 100 according to an embodiment of the disclosure.

The photodetector 100 according to an embodiment may perform the operations of absorbing surface plasmon polaritons (SPPs) generated by combining surface plasmons (SPs) with photons of a light wave, and generating photocurrent. The photodetector 100 may generate the photocurrent by inducing the photocurrent through tunneling caused by the absorbed SPPs.

Specifically, the photodetector 100 according to an embodiment may include a metal layer 102, a light absorbing layer 104, and semiconductor layers 105, 106, 107, and 108.

The metal layer 102 shields incident light 101, and photons of the shielded incident light 101 interacts with SPs generated at an interface with a dielectric, thereby generating the SPPs.

Further, the light absorbing layer 104 absorbs the generated SPPs and allows charges excited by the absorbed SPPs and a localized electric field effect to tunnel through the semiconductor layers 105, 106, 107, and 108 via an insulation film.

The semiconductor layers 105, 106, 107, and 108 may induce the photocurrent based on an electric field of tunneled electrons.

For this purpose, Node A 106, Node B 107, and Node D 108 may be formed with different impurity doping polarities and concentrations on a silicon substrate, as illustrated in FIG. 1. Further, Node C 104 may be formed of polysilicon or a metal, with the insulator 105 interposed between Node C 104 and the nodes 106, 107, and 108.

According to an embodiment, the photodetector 100 may be formed by shielding a whole light incident surface with the metal layer 102, and artificially forming a metal layer-free nanohole 103 of a dielectric material with a large dielectric constant, not a metal, over Node C as the light absorbing layer 104.

According to an embodiment, the nanohole 103 may be formed of a material with a greater dielectric constant than air. For example, the nanohole 103 may be formed of a material containing $Si_3N_4$.

In this structure, when visible light and near-infrared light reach the surface, the wavelengths of the light are larger than the size of the nanohole 103. Therefore, the light fails to directly pass through the metal-free part and thus generate semiconductor excitons.

Instead, the incident light is coupled with the metal into SPPs. The SPPs propagate along the interface between the metal layer 102 and the dielectric on the surface and then meet the nanohole 103.

The SPPs form localized surface plasmons (LSPs) at edges where the metal layer 102 meets the dielectric. The SPPs cause strong electric field enhancement, thereby generating an electric field toward the silicon substrate.

Further, the SPPs are increased in momentum and energy based on a wave vector changed by the incident light and effectively react with excitons of polysilicon, a silicon oxide film, and the substrate, thereby exciting lots of charges.

The excited charges tunnel into Node C 104 through the silicon oxide film by the strongly enhanced electric field at edges of the nanohole 103 on the metal surface, and thus changes the total charge amount of Node C 104.

The change of the charge amount of Node C 104 in turn changes the threshold voltage of a current channel formed at the interface between the silicon oxide film and the silicon, resulting in induction of photocurrent.

When a large number of electrons are introduced into Node C 104 or Node C 104 is formed of a metal, the SPPs converted by the incident light may be generated between Node A 106 and Node B 107 and thus make a direct contribution as photocurrent.

In the disclosure, the photodetector utilizes the phenomenon that in the world of nano photonics, the light speed is not constant, light may be stopped, and a strongly enhanced electric field is generated at a metal-dielectric interface by SPPs being a combination of light and SPs which are collective oscillations of free electronics through coupling between the light and the free electrons on the metal surface.

This phenomenon is that ordinary light interacts with a metal and is converted to SPPs. The wavelength of the light is compressed to react with a semiconductor, with the new physical properties of increased momentum and energy. Further, as this phenomenon changes the size and structure of the surface metal layer, the resonance spectrum or the dispersion peak of the SPPs may be controlled. Then, a very efficient and innovative photoelectric conversion characteristic may be achieved by some special quantum mechanical designs in the operation and structure of the photodetector.

The photodetection characteristics of a photodetector basically adopting a PN junction structure or an existing photo assisted tunneling-photodetector (PAT-PD) relies on the principle of converting charges excited directly from the photon energy of incident light into a current or voltage. Therefore, the internal quantum efficiency of photoelectric conversion may be greatly affected by the size of the detector or the angle of incident light. In the disclosure, however, the characteristics may be extended to an image sensor by applying a structure and operation principle that combine SPPs resulting from interaction between light and a metal with the quantum tunneling phenomenon to a novel photodetector.

That is, when SPPs generated by irradiating light onto SPs existing at a metal-dielectric interface meet a nano-sized artificial metal structure, localized plasmonic field enhancement occurs, and the wave vector of the SPPs becomes larger than that of the incident light. When it is said that the wave vector increases, this means that the energy and momentum become greater and the wavelength becomes smaller than those of the incident light. Photoelectric characteristics with a very high internal quantum efficiency may be achieved by converting incident light into SPPs on a metal surface and coupling the SPPs with a semiconductor, for use in light excitation, rather than by generating excitons, that is, electron-hole pairs through direct absorption of light into the semiconductor. This implies that a material with a large dielectric constant should be selected and a photodetector should be specially fabricated in terms of structure, in order to efficiently generate and utilize SPPs.

The operation principle and structure of photoelectric conversion according to an embodiment are described below. A detector of a PN junction structure with a low quantum efficiency is not used as a light receiving portion. Particularly, the light receiving portion is fabricated in a structure in which SPPs generated on a metal surface by light interact with excitons generated from a semiconductor, the resulting excited electrons are fast tunneled into a specific space through an insulator, and then photocurrent is induced by the electric field effect of the tunneled electrons. The electric field that causes efficient tunneling mainly relies on LSPs generated by the SPPS and nano-structures, and a plasmonic field enhancement effect. More specifically, the surface metal layer of the light receiving portion is opened to a size of couple of tens of nano-meters to couple of hundreds of nano-meters, and the remaining part of the surface metal layer is shielded, to partially generate electric field enhancement. A material such as Si3N4, which has a greater dielectric constant than air, is used for the metal-free open part, and the thickness of the material is controlled so that incident light may reach the interface between the dielectric and the metal. Then, photons interact with SPs at the metal-dielectric interface, thereby generating SPPs. When the SPPs meet the nano-sized non-metallic dielectric during propagation on the metal surface, LSPs are generated and the electric field enhancement phenomenon occurs to edges at which the metal ends. The electric field enhancement tunnels charges excited by the SPPs, and efficiently induces photocurrent.

However, even though the incident light is converted into SPPs with large energy and momentum and interacts with excitons, excitation of excitons which are in a long wavelength band and have smaller energy than the band gap energy of silicon, for example, in a wavelength equal to or longer than 1200 nm should be processed separately as follows.

First, artificial localized interface states are generated at a specific part of a light absorption path within the band gap of silicon. In general, before device fabrication, the bonding state of the dangling bond of initial silicon is controlled by some surface cleaning of a silicon substrate, to facilitate formation of excitons by long-wavelength absorption. However, localized states may be generated separately by combining one to two mono layers of a material such as N or Ge with a silicon surface and then forming an oxide layer. The localized quantum states generated within the band gap transition electron-hole pairs and convert the electron-hole pairs to an electric signal, through interaction with the SPPs.

In this case, the density of the localized quantum states is generally not high, which makes it difficult to expect efficient photoelectric conversion characteristics. In the disclosure, however, photoelectric conversion utilizes the phenomenon that SPPs are generated by bringing incident light in a long wavelength equal to or longer than 1200 nm into contact first with a metal, and thus the wave vector of the SPPs become larger than that of the incident light, without generating excitons directly from the incident light.

That is, it is possible to convert incident light into SPPs with the same frequency and a changed light speed, propagate the SPPs to a nano-sized light receiving portion, and very efficiently excite electrons trapped in localized quantum states.

In reality, since the area of a light absorbing layer (light receiving portion) directly affects light reception efficiency in a typical photodetector being a PN junction diode, an area in which light is incident should be increased to achieve high sensitivity. However, as the light absorption area decreases, the photoelectric conversion efficiency increases, in view of the structure and operation principle in which charges tunneled by the plasmonic field enhancement effect near a nanohole on a nano-sized metal thin film change the charge amount of a gate and thus photocurrent is induced, in the disclosure.

This is because the wave vector of the SPPs generated from interaction between incident light and a metal becomes larger than the wave vector of the incident light, and thus energy and momentum for exciting excitons increase. That is, as the size of the metal hole decreases, the density of a localized electric field per unit area increases. Hence, the probability of tunneling excited charges through an oxide film increases and strong photocurrent is generated accordingly, thereby increasing photoelectric conversion efficiency. Although aluminum is usually available for the metal layer, a precious metal such as gold (Au) or silver (Ag) may be additionally coated on the surface of the metal layer to further activate the generation of SPPs.

Figure 2:
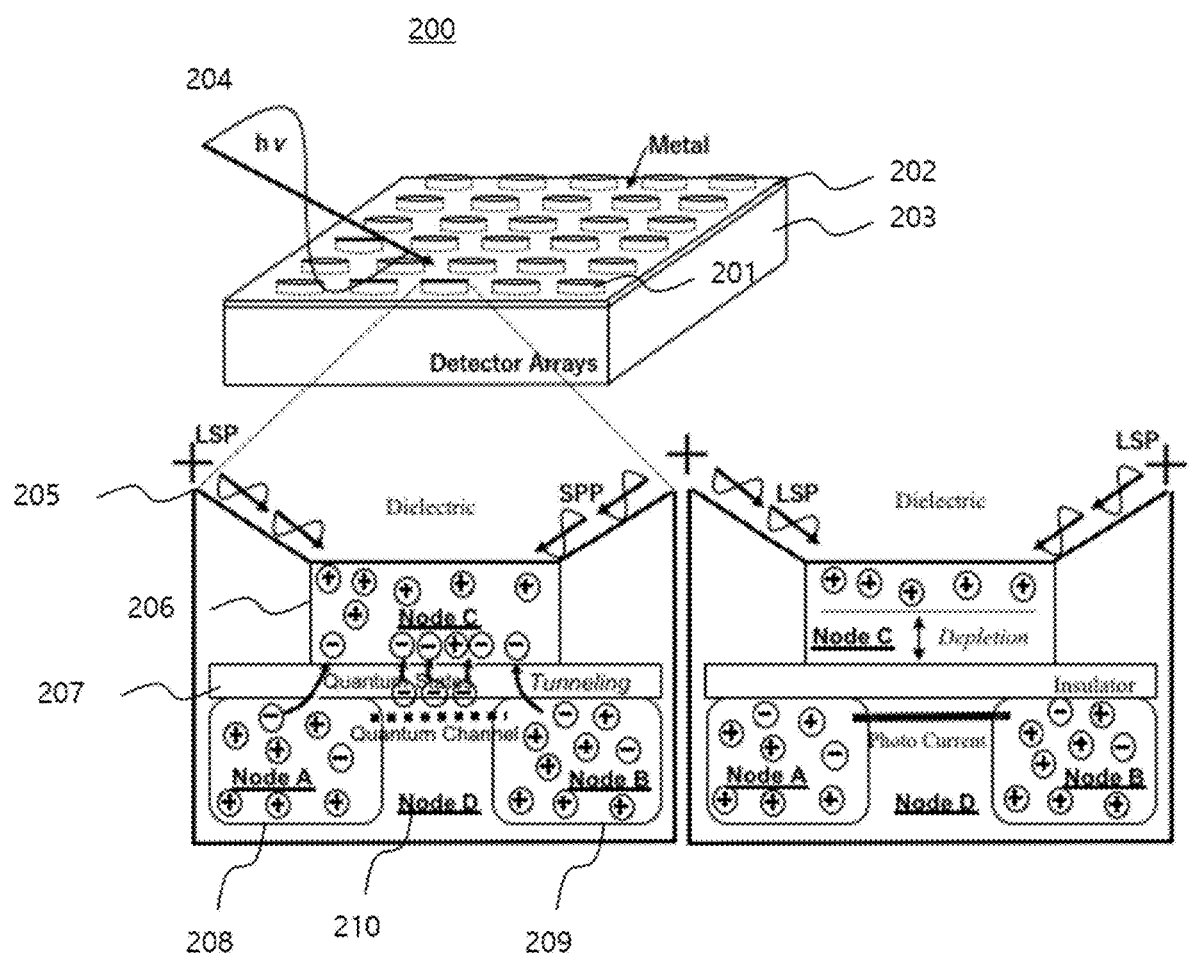
FIG. 2 is a diagram illustrating an image sensor according to an embodiment of the disclosure.

FIG. 2 is a diagram illustrating an image sensor 200 according to an embodiment of the disclosure.

The image sensor 200 according to an embodiment may include a metal surface 202, a metal nanohole array 201 formed on the metal surface 202, and a detector array 203 formed at a position corresponding to the metal nanohole array 201.

A method of operating the image sensor 200 according to an embodiment may include generating photocurrent by using the metal nanohole array formed on the metal surface and the detector array formed at the position corresponding to the metal nanohole array.

In the method of operating the image sensor 200, the generation of photocurrent may include absorbing SPPs generated by combining SPs formed on the metal surface with photons of a light wave, and generating the photocurrent by using the absorbed SPPs, in the detector array.

According to an embodiment, the metal surface 202 may shield incident light, and the photons of the shielded incident light may interact with SPs generated at an interface with a dielectric, thereby generating the SPPs.

Further, the detector array 203 according to an embodiment may include a light absorbing layer 206 and semiconductor layers 207, 208, 209, and 210.

The light absorbing layer 206 represented as Node C may absorb the generated SPPs, and tunnel charges excited by the absorbed SPPs and the localized electric field effect through an insulating film.

Further, the semiconductor layers 207, 208, 209, and 210 may induce photocurrent based on the electric field of tunneled electrons.

For example, the detector array 203 may absorb SPPs generated by combining photons of a light wave with SPs formed on the metal surface 202, to generate photocurrent.

According to an embodiment, the metal nanohole array 201 may be formed directly on the detector array 203. The distance between metal nanoholes is at least a few micrometers, which makes it substantially difficult to allow the SPPs to propagate from a metal nanohole to its adjacent metal nanohole and affect the adjacent metal nanohole.

As illustrated in FIG. 2, the momentum and energy of the SPPs increase based on a wave vector converted by incident light 204. Further, the SPPs with the increased momentum and energy may excite lots of charges by more efficiently reacting with excitons in polysilicon, a silicon oxide film, and a substrate.

The excited charges may tunnel into Node C 206 corresponding to the light absorbing layer through the silicon oxide film by a strongly enhanced electric field at edges of a metal nanohole 201 on the metal surface 202, thus changing the total charge amount of Node C 206. Further, a depletion region is generated in a part adjacent to the oxide film due to the changed total charge amount, affecting the electric field of the channel. As a result, the change in the charge amount of Node C 206 leads to a change in the threshold voltage of the current channel formed at the interface between the silicon oxide film and silicon and hence induction of photocurrent. Further, when the voltage of Node C 206 is externally adjusted, output characteristics such as sensitivity, a dynamic range, and signal linearity may be freely adjusted.

Figure 3:
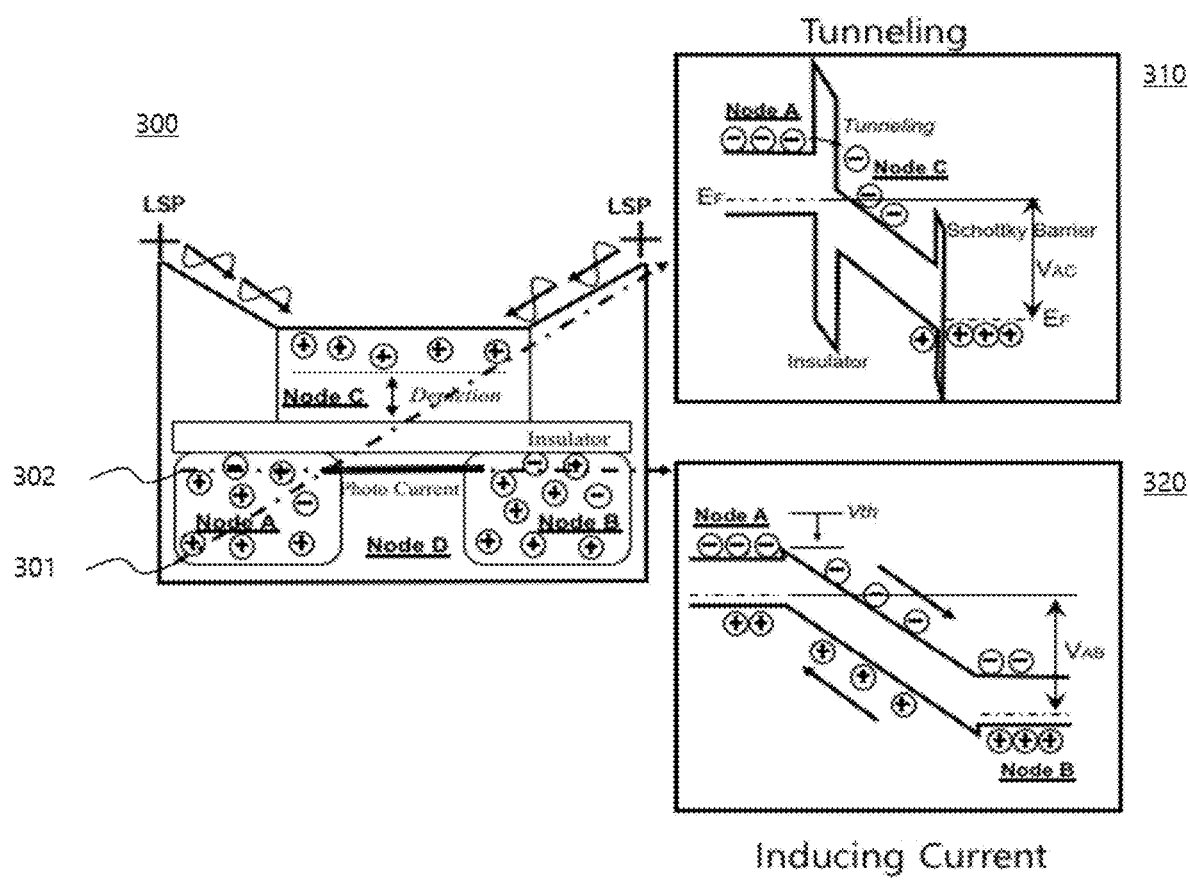
FIG. 3 is a diagram illustrating a photocurrent generation mechanism in an energy band diagram.

FIG. 3 is a diagram illustrating a photocurrent generation mechanism in an energy band diagram.

FIG. 3 illustrates an operation principle based on an energy level along a cross-section of a photodetector 300 in a direction 301 and an operation principle based on an energy level along a cross-section of the photodetector 300 in a direction 302.

Regarding the direction 310, SPPs may interact with the energy level of each of a polysilicon gate, a strained silicon layer, and bulk silicon, thereby generating electron-hole pairs. Further, electrons excited simultaneously with the generation of the electron-hole pairs tunnel through a channel formed at a silicon interface by an electric field and the oxide film in Node B, as indicated by reference numeral 310. Further, the electrons deplete the area of Node C between P-doped Node C and the oxide film along with the tunneling.

Regarding the direction 320, Node C to which depletion has occurred due to the tunneling of the electrons experiences a change in its total charge amount. This substantially affects a threshold voltage between Node A and Node B. This amounts to the effect of changing the size of an electric field between current channels affected by the change of the charge amount in Node C. Therefore, photocurrent is generated through the channel according to a variation in channel conductance.

A final factor affecting the channel conductance is the tunneling of electrons excited by the SPPs. That is, interaction with the SPPs allows each energy level to determine the wavelength response characteristics of the photodetector. If light incoming is stopped, the photodetector is placed in a dark state, and thus SPPs are neither generated nor interact, the electrons that has tunneled into and depleted Node C tunnel again to Node C and the channel region. Therefore, the charge amount of Node C returns to its original value. Further, the depletion layer tends to decrease, and the photocurrent caused by the SPPs naturally disappears in the channel.

Figure 4:
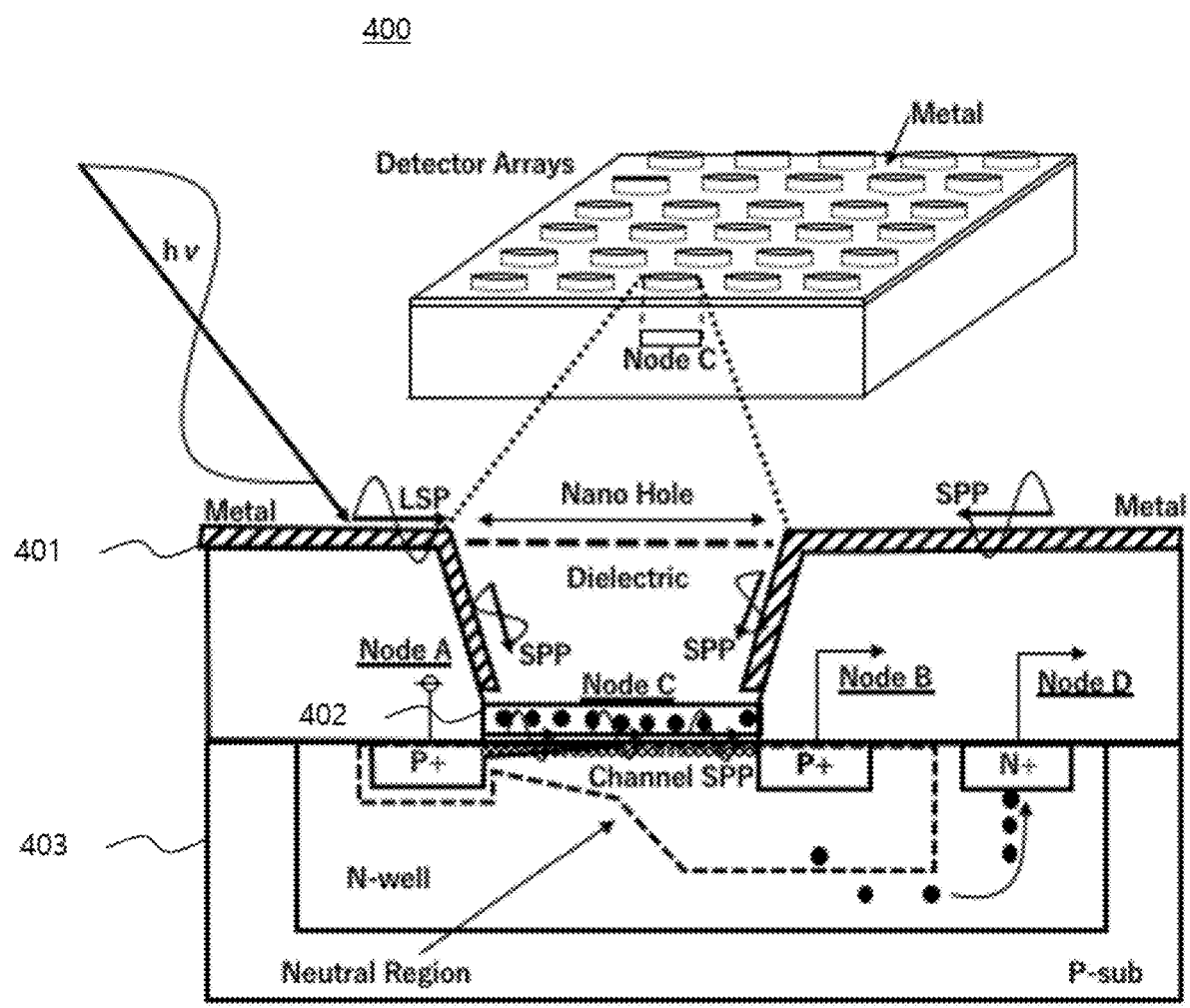
FIG. 4 is a diagram illustrating an embodiment of directly generating surface plasmon polaritons (SPPs) in a photocurrent channel.

FIG. 4 is a diagram illustrating an embodiment 400 of directly generating SPPs in a photocurrent channel.

When SPPs generated by incident light propagates on the surface of a metal layer 401 and encounters a dielectric with a different dielectric constant from that of a metal nanohole, the wave vector of the SPPs changes. The newly generated SPPs propagate toward a semiconductor substrate 403. Since a resonance frequency changes according to the size of the nanohole, the size of the nanohole may be adjusted according to a wavelength of incident light to be detected.

Particularly, when the newly generated SPPs are induced to a channel between a silicon substrate and an oxide film 402, a bias is applied to an electrode between Node A and Node B, so the SPPs flow directly as photocurrent through Node B.

Further, lots of electrons are tunneled to Node C to have properties similar to those of a metal. These electrons may create a situation in which the SPPs directly contribute to photocurrent as well as lead to direct induction of the SPPs to the interface of the dielectric of the oxide film 402 contacting Node C and interaction between the SPPs and excitons.

Figure 5:
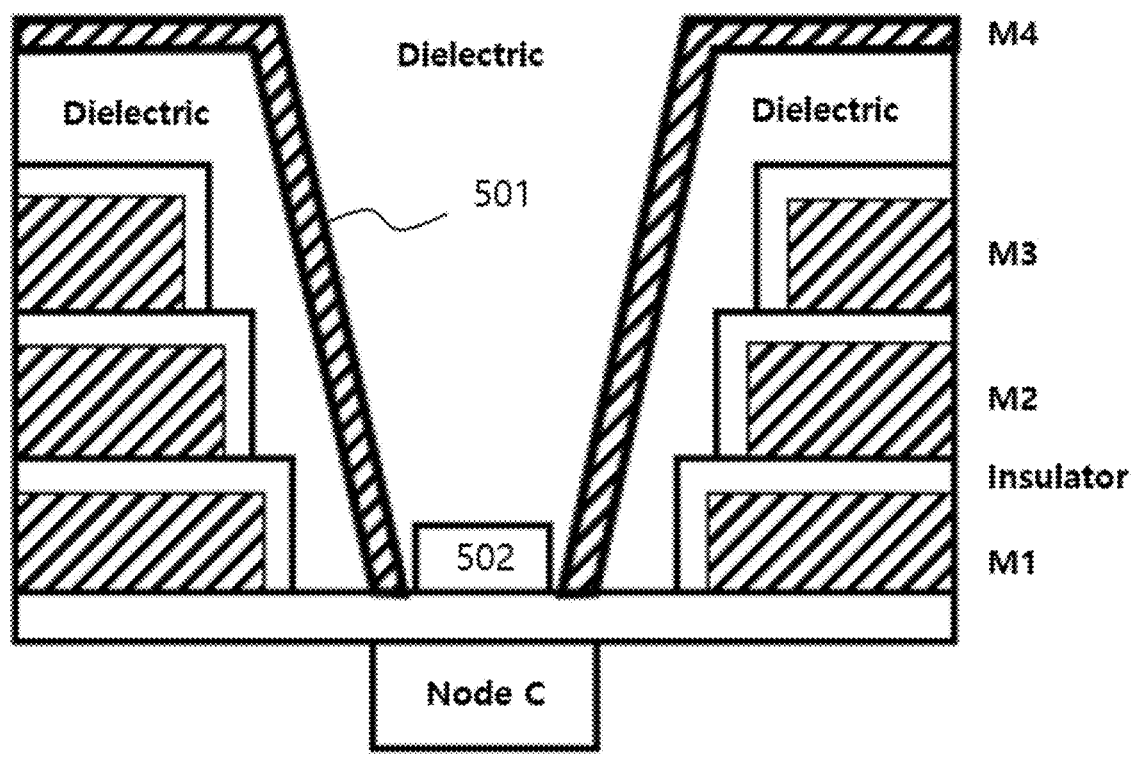
FIG. 5 is a diagram illustrating an embodiment of directly propagating SPPs to a light absorbing layer based on a metal composition.

FIG. 5 is a diagram illustrating an embodiment 500 of directly propagating SPPs to a light absorbing layer according to a metal composition.

According to an embodiment, a metal surface 501 may extend from a surface to a light absorbing layer 502 to guide generated SPPs to the light absorbing layer 502.

A detector array may generate photocurrent by absorbing the SPPs generated by combining photons of a light wave with SPs formed on the metal surface 501.

The embodiment 500 is a structure of extending the metal surface 501 in a semiconductor depth direction to guide the SPPs, to maximize photoelectric conversion based on the SPPs. When the SPPs come into direct contact with Node C, the SPPs may directly bring electric field enhancement to a channel in addition to the LSP effect of a nanohole. Therefore, photocurrent may be induced efficiently without relying on threshold voltage modulation based on tunneling of charges. Further, the probability of interacting the SPPs with an oxide film and a strained layer on the interface of the oxide film increases, and thus extended long wavelength response characteristics may be achieved efficiently.

Figure 6:
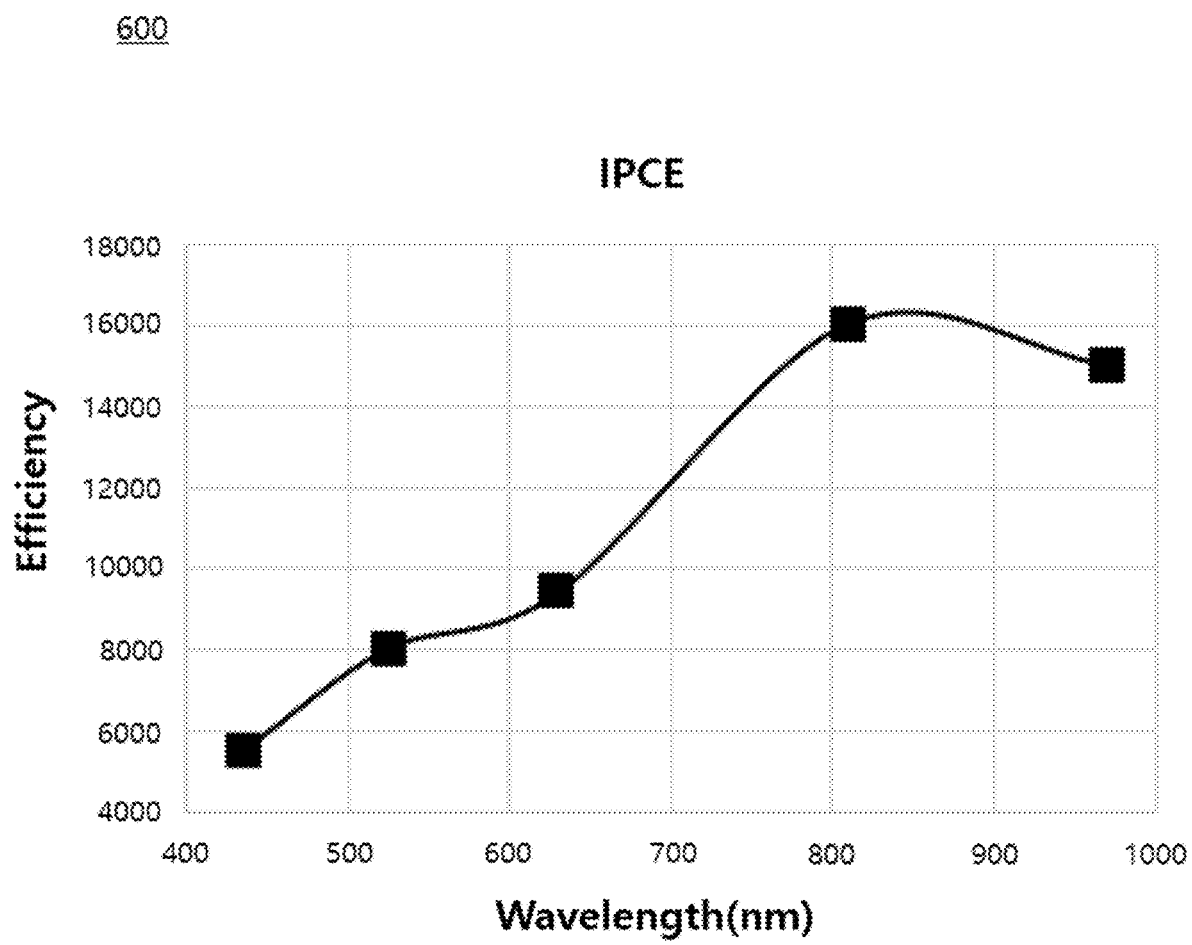
FIG. 6 is a graph illustrating incident photo to current efficiency (IPCE) according to the disclosure.

FIG. 6 is a graph 600 illustrating incident photon to current efficiency (IPCE) according to the disclosure.

In the graph 600, the horizontal axis represents wavelength (nm), and the vertical axis represents efficiency.

The graph 600 may reveal photoelectric conversion efficiency based on the enhanced electric field and tunneling effect caused by SPPs based on interaction between incident light and a metal layer. Specifically, the graph 600 illustrates IPCE measurements obtained by changing the wavelength band of incident light in a detector structure having a 200-nm nanohole metal layer. The measurements on the graph 600 are percentages of the number of charges in photoelectrically converted output current with respect to the number of photons of incident light as an input.

As noted from the graph 600, a very high photoelectric conversion efficiency (6000 to 16000%) is observed in a 450 to 950 nm region in which photons of incident light are directly absorbed into a semiconductor and thus does not generate excitons.

Particularly, the graph 600 shows that as the wavelength of incident light increases, the efficiency increases, when the resonance condition of the enhanced electric field of LSPs is near the wavelength of 800 nm according to a nanohole size.

It may be concluded that the use of the disclosure leads to photoelectric conversion such that SPPs may directly contribute to photocurrent through SPs and SPPs which are generated at an interface of different dielectric constants by interacting a metal layer with incident light.

Further, charges excited by the SPPs generated through interaction between the incident light and the metal layer tunnel into a separate space through an insulation film, changing the charge amount in the space and the size of a depletion layer and then affecting the threshold voltage of an adjacent current channel. Therefore, a light sensing capability may be maximized.

While the embodiments have been described with reference to the limited drawings, those skilled in the art could make many variations and modifications from the above description. For example, even though the described technique is implemented in a different order from the described method and/or components such as the described system, structure, device, circuit, and so on are combined in a different manner or replaced with other components or their equivalents, appropriate results may be achieved.

Accordingly, other implementations, other embodiments, and equivalents to the appended claims fall within the scope of the appended claims.

What is claimed is:

1. A photodetector comprising:
a metal layer that shields incident light propagating in air and generates surface plasmon polaritons (SPPs);
a light absorbing layer that absorbs the generated SPPs and allows charges, including electrons, excited by the absorbed SPPs and a localized electric field effect to tunnel;
a dielectric formed at nanoholes in which at least a part of the metal layer is opened and formed over the light absorbing layer; and
a semiconductor layer that induces photocurrent based on an electric field effect of the tunneled electrons,
wherein the SPPs form localized surface plasmons (LSPs) propagating at an edge where the metal layer meets the dielectric and the SPPs are absorbed into the semiconductor layer.

2. The photodetector according to claim 1, wherein density of a localized electric field is configured to increase per unit area to increase the photocurrent as a size of the nanoholes decreases.

3. The photodetector according to claim 1, wherein the photocurrent is generated at the semiconductor layer by absorbing the surface plasmon polaritons (SPPs) at the light absorbing layer.

4. The photodetector according to claim 3, wherein the generated SPPs are absorbed into the light absorbing layer through the nanoholes.

5. The photodetector according to claim 4, wherein the nanoholes are formed of a material having a greater dielectric constant than air.

6. The photodetector according to claim 4, wherein the nanoholes are formed of a material containing $Si_3N_4$.

7. The photodetector according to claim 1, wherein the metal layer contains at least one of aluminum (Al), gold (Au), or silver (Ag).

8. The photodetector according to claim 1, wherein the metal layer is extended from a surface to the light absorbing layer and guides the generated SPPs to the light absorbing layer.

9. An image sensor comprising:
a metal surface;
a metal nanohole array formed on the metal surface; and
a detector array formed at a position corresponding to the metal nanohole array,
wherein the metal surface is configured to shield incident light propagating in air and to generate surface plasmon polaritons (SPPs),
wherein the detector array comprises:
a light absorbing layer that absorbs the generated SPPs and allows charges, including electrons, excited by the absorbed SPPs and a localized electric field effect to tunnel;
a dielectric formed at nanoholes in which at least a part of the metal surface is opened and formed over the light absorbing layer; and
a semiconductor layer that induces photocurrent based on an electric field effect of the tunneled electrons,
wherein the SPPs form localized surface plasmons (LSPs) propagating at an edge where the metal surface meets the dielectric and the SPPs are absorbed into the semiconductor layer.

10. The image sensor according to claim 9, wherein the detector array generates the photocurrent by inducing the photocurrent through tunneling caused by the absorbed SPPs.

11. The image sensor according to claim 9, wherein density of a localized electric field is configured to increase per unit area to increase the photocurrent as a size of the nanoholes decreases.

12. The image sensor according to claim 9, wherein the metal surface is extended from a surface to the light absorbing layer and guides the generated SPPs to the light absorbing layer.

13. A method of operating a photodetector, the method comprising:
generating, at a metal layer that shields incident light propagating in air, surface plasmon polaritons (SPPs), the SPPs being generated by combining surface plasmons (SPs) with photons of a light wave;
absorbing, at a light absorbing layer, the generated SPPs; and
generating photocurrent, at a semiconductor layer, by using the absorbed SPPs,
wherein the SPPs form localized surface plasmons (LSPs) propagating at an edge where the metal layer meets a dielectric formed at nanoholes in which at least a part of the metal layer is opened and formed over the light absorbing layer, and the SPPs are absorbed into the semiconductor layer.

14. The method according to claim 13, wherein the generating photocurrent comprises inducing the photocurrent through tunneling caused by the absorbed SPPs.

15. A method of operating an image sensor, the method comprising:
generating photocurrent by using a metal nanohole array formed on a metal surface and a detector array formed at a position corresponding to the metal nanohole array,
wherein the generating photocurrent comprises:
generating surface plasmon polaritons (SPPs) at a metal surface that shields incident light propagating in air, the SPPs being generated, by the detector array, by combining surface plasmons (SPs) formed on the metal surface with photons of a light wave;
absorbing at a light absorbing layer the generated SPPs; and
generating, at a semiconductor layer, the photocurrent by using the absorbed SPPs by the detector array,
wherein the SPPs form localized surface plasmons (LSPs) at an edge where the metal surface meets a dielectric formed at nanoholes in which at least a part of the metal surface is opened and formed over the light absorbing layer, and the SPPs are absorbed into the semiconductor layer.

16. The method according to claim 15, wherein the generating the photocurrent comprises inducing the photocurrent through tunneling caused by the absorbed SPPs.

* * * * *